United States Patent [19]

Thaden

[11] Patent Number: 4,718,037

[45] Date of Patent: Jan. 5, 1988

[54] MICROCOMPUTER CONTAINING EPROM WITH SELF-PROGRAM CAPABILITY

[75] Inventor: Robert C. Thaden, Houston, Tex.

[73] Assignee: Texas Instrumens Incorporated, Dallas, Tex.

[21] Appl. No.: 32,938

[22] Filed: Mar. 26, 1987

Related U.S. Application Data

[63] Continuation of Ser. No. 808,221, Dec. 12, 1985, abandoned, which is a continuation of Ser. No. 365,828, Apr. 5, 1982, abandoned.

[51] Int. Cl.⁴ .............................................. G06F 13/00
[52] U.S. Cl. ................................................... 364/900
[58] Field of Search ... 364/200 MS File, 900 MS File

[56] References Cited

U.S. PATENT DOCUMENTS

| | | | |
|---|---|---|---|
| 3,944,984 | 3/1976 | Morley et al. | 364/900 |
| 4,093,998 | 6/1978 | Miller | 364/900 |
| 4,156,926 | 5/1979 | Hartman | 364/900 |
| 4,325,130 | 4/1982 | Tiltscher | 364/900 |
| 4,344,154 | 8/1982 | Klaas et al. | 364/194 |
| 4,441,164 | 4/1984 | Pavan et al. | 364/900 |

*Primary Examiner*—Eddie P. Chan
*Attorney, Agent, or Firm*—Richard K. Robinson; Robert D. Marshall, Jr.; Rodney M. Anderson

[57] ABSTRACT

An electronic digital processor system including an internal memory means further including an electrically programmable read-only memory for the storage of data and commands which define operations on the data. Also included is an arithmetic and logic unit for performing operations on the data and a register set for temporary storage of data and addresses. Further included is a plurality of data paths which couple the internal memory with the arithmetic and logic unit and registers. Control and timing circuitry is provided for the execution of commands that access the memory and arithmetic and logic unit by the registers and for the execution of commands for programming the electrically programmable read-only memory.

6 Claims, 22 Drawing Figures

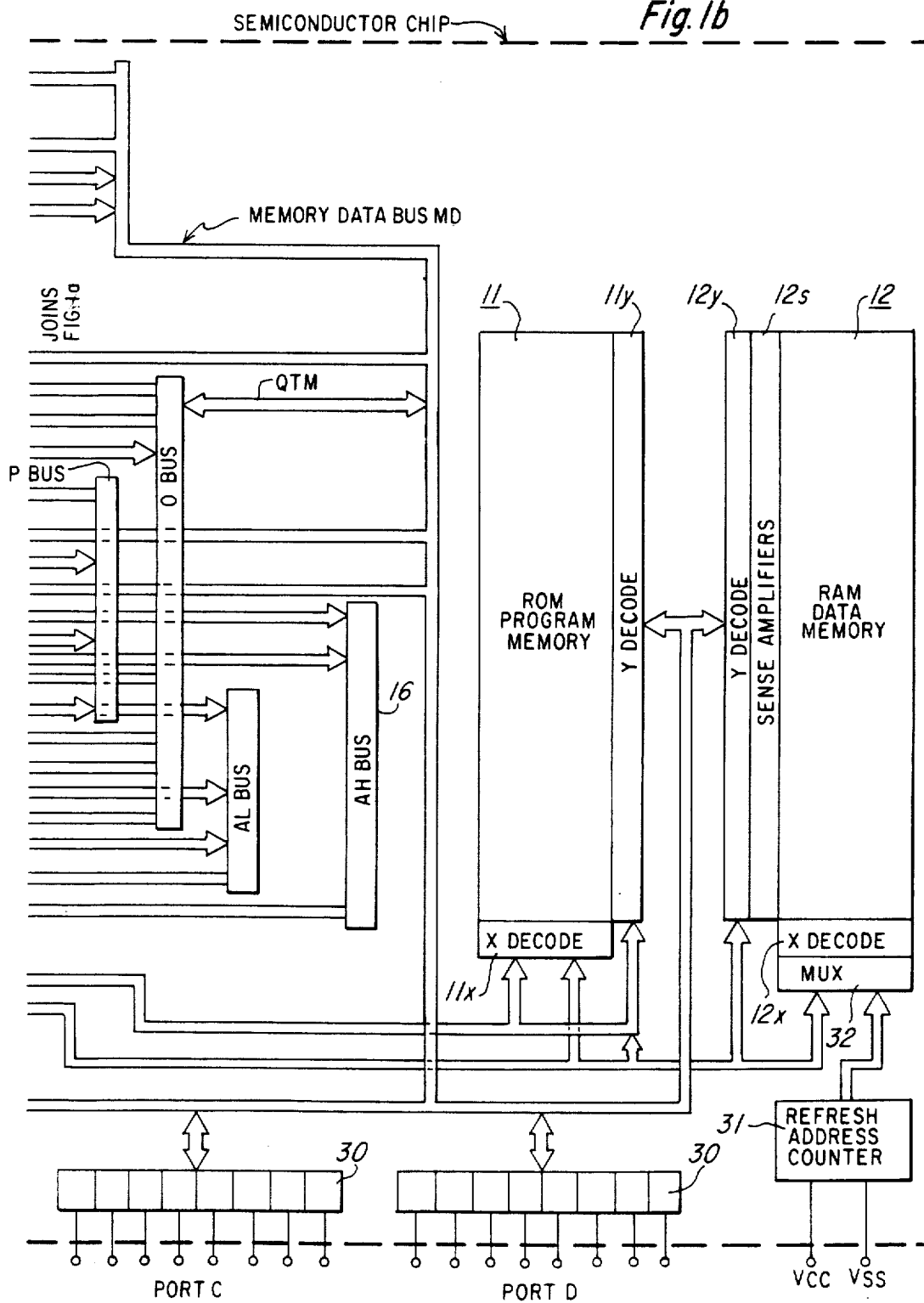

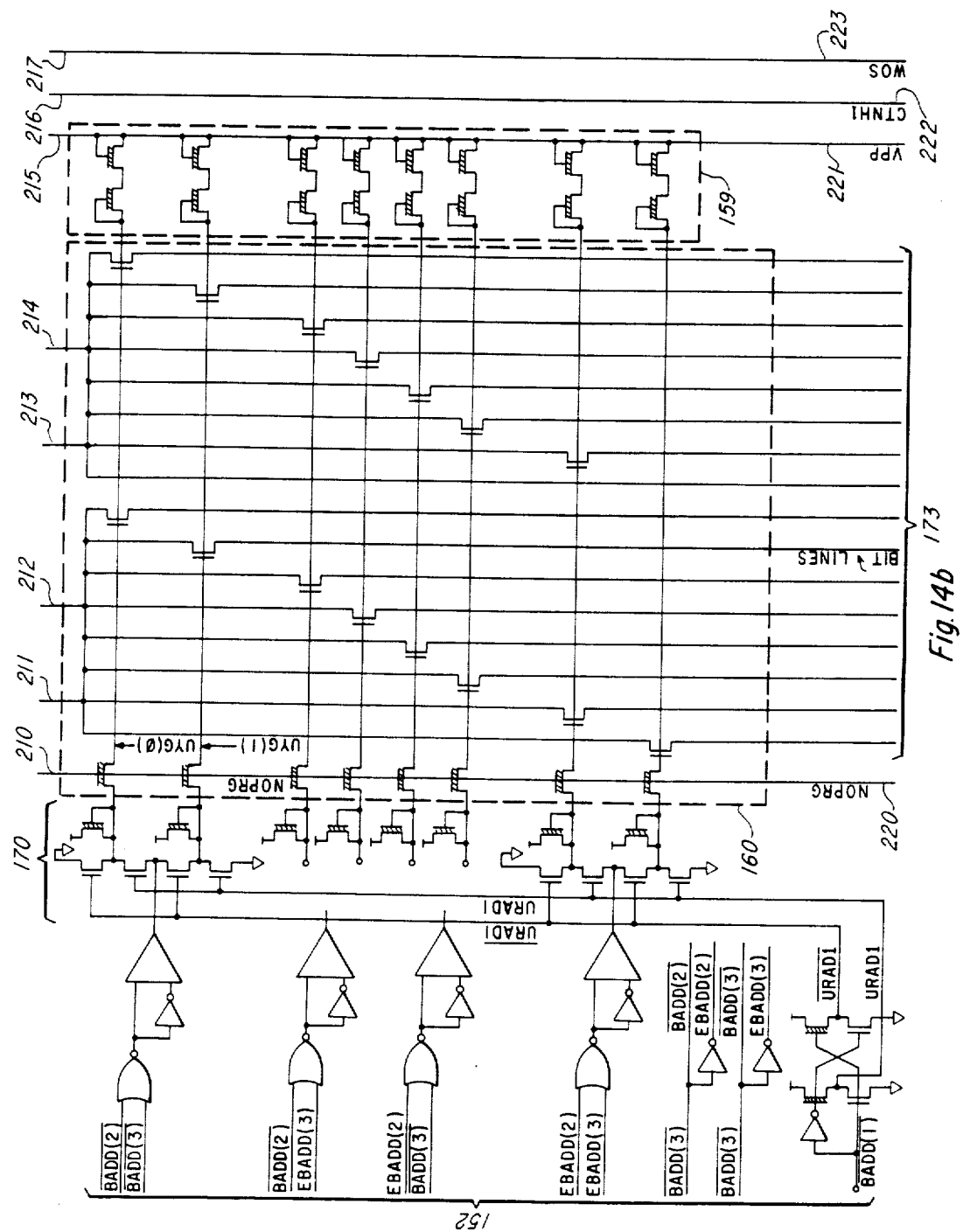

MICROCOMPUTER CONTAINING EPROM WITH SELF-PROGRAM CAPABILITY

This application is a continuation of application Ser. No. 808,221, filed Dec. 12, 1985, now abandoned, which is a continuation of application Ser. No. 365,828, filed Apr. 5, 1982, now abandoned.

1. Field of the Invention

This invention relates to integrated semiconductor devices and more particularly to electronic digital processing systems of a single chip microprocessor or microcomputer form.

2. Description of the Prior Art

A microprocessor device is a central processing unit or CPU for a digital processor which is contained in a single semiconductor integrated circuit, usualy fabricated by "MOS/LSI" technology, as shown in U.S. Pat. No. 3,757,306 issued to Gary W. Boone and assigned to Texas Instruments. The Boone patent shows an 8-bit CPU on a chip including a parallel ALU, registers for data and addresses, an instruction register and a control decoder, all interconnected using a bidirectional parallel bus. U.S. Pat. No. 4,074,351, issued to Gary W. Boone and Michael J. Cochran, assigned to Texas Instruments, shows a single-chip "microcomputer" type device which contains a 4-bit parallel ALU and its control circuitry, with on-chip ROM and RAM for program and data storage. The term microprocessor usually refers to a device employing external memory for program and data storage, while the term microcomputer refers to a device with on-chip ROM and RAM for program and data storage; the terms are also used interchangeably, however, and are not intended as restrictive as to this invention.

Subsequent to 1971 when U.S. Pat. Nos. 3,757,306 and 4,074,351 were originally filed, many improvements have been made in microprocessors and microcomputers to increase the speed and capability of these devices and reduce the cost of manufacture, provided more circuitry in less space, i.e., smaller chip size. Improved photolithographic techniques allow narrower line widths and higher resolution, provided added circuit density, but circuit and system improvements also contribute to the goals of increased performance with smaller chip size. Some of these improvements in microprocessors are disclosed in the following U.S. Pats. Nos., all assigned to Texas Instruments: 3,911,305 issued to Edward R. Caudel and Joseph H. Raymond, Jr.; 4,156,927 issued to David J. McElroy and Graham S. Tubbs; 3,934,233 issued to R. J. Fisher and G. D. Rogers; 3,921,142 issued to J. D. Bryant and G. A. Hartsell; 3,900,722 issued to M. J. Cochran and C. P. Grant; 3,932,846 issued to C. W. Brixey et al; 3,939,335 issued to G. L. Brantingham, L. H. Phillips and L. T. Novak; 4,125,901 issued to S. P. Hamilton, L. L. Miles, et al; 4,158,432 issued to M. G. VanBavel; 3,757,306 and 3,984,816.

Additional examples of microprocessor and microcomputer devices in the evolution of this technology are described in publications. In *Electronics*, Sept. 25, 1972, pp. 31-32, a 4-bit P-channel MOS microcomputer with on-chip ROM and RAM is shown which is similar to U.S. Pat. No. 3,991,305. Two of the most widely used 8-bit microprocessors like that of U.S. Pat. No. 3,757,306 are described in *Electronics*, Apr. 18, 1974 at pp. 88-95 (the Motorola 6800) and pp. 95-100 (the Intel 8080). A microcomputer version of the 6800 is described in *Electronics*, Feb. 2, 1978 at pp. 95-103. Likewise, a single-chip microcomputer version of the 8080 is shown in *Electronics*, Nov. 25, 1976 at pp. 99-105 and a 16-bit microprocessor evolving from the 8080 is described in *Electronics*, Feb. 16, 1978, pp. 99-104. Another single-chip microcomputer, the Mostek 3872, is shown in *Electronics*, May 11, 1978, at pp. 105-110. An improved version of the 6800 is disclosed in *Electronics*, Sept. 17, 1979 at pp. 122-125, while a 16-bit microprocessor identified as the 68000 which evolved from the 6y800 is described in *Electronic Design*, Sept. 1, 1978 at pp. 100-107.

The technology of integrated circuit design and manufacture has progressed to a point where virtually any electronic system having digital processing or control functions can employ a microcomputer or microprocessor chip. The cost of designing and manufacturing the devices is a limiting factor, however. Semiconductor manufacturing is oriented toward production of large quantities of a single device type, rather than production of a few of many different specialty items, and so to be economical a chip design must be adaptable for a wide variety of uses, not only by changing the ROM code but also by providing many input/output options and similar features. Thus, a device as in U.S. Pat. No. 3,991,305 has been manufactured in quantities of millions of units for many different electronic calculators, electronic games, appliance controllers, and the like. Not only the semiconductor manufacturing cost is minimized by use of the same device, but also the design cost is minimized becuase very little circuit design is needed (only external to the chip) and the programming effort employs an instruction set and commonly-used subroutines and algorithms in which a high level of experience is acquired. Nevertheless, the design cost for using a microcomputer device in a new application may be prohibitive even though only assembly language programming is needed; this software cost is unduly high because of the number of different and incompatable programming languages used on the wide variety of device types.

Microcomputers of the type in U.S. Pat. No. 4,074,351 have included onboard program ROMs which contain the instructions to be executed by the microcomputer. These programs must be specified at time of manufacture so that the ROMs aboard the microcomputers may be manufactured.

It is an object of this invention to provide a microcomputer or microprocessor with an electrically programmable read-only memory program memory for containing instructions to be executed by the microprocessor or microcomputer. It is a further object of this invention to provide a mechanism to self-program the electrically programmable read-only memory.

SUMMARY

In accordance with the present invention, an electronic digital processor system is provided that includes an internal memory which further includes an electrically programmable read-only memory for the storage of data and commands which define operations on the data. A digital processor system further includes an arithmetic and logic unit for performing operations on the data. Registers for the temporary storage of data and temporary storage of addresses for accessing the internal memory are also provided and are connected via a plurality of data paths that couple the arithmetic and logic unit to the memory and registers. The digital processor system is controlled by control and timing circuitry for execution that is provided for the execution of commands for accessing the memory, the arithmetic and logic unit and arithmetic and logic unit by the registers and for the execution of commands for programming the electrically programmable read-only memory.

In the preferred embodiment, an electronic digital processor system integrated monolithically on a single semiconductor substrate is provided that includes an electrically programmable read-only memory for the storage of data and commands which define operations on the data. The digital processing system also includes an arithmetic and logic unit for performing operations on data which is connected to a register set. The register set is provided for the temporary storage of data and temporary storage of addresses for accessing the memory. The registers, arithmetic and logic unit and memory are interconnected by a plurality of data paths. The digital processor system is controlled by control and timing circuitry which includes the means for executing commands for accessing the memory and arithmetic and logic unit by the register and for executing commands for programming the electrically programmable read-only memory.

DETAILED DESCRIPTION OF THE PREFERRED EMBODIMENT

Figure 1A:
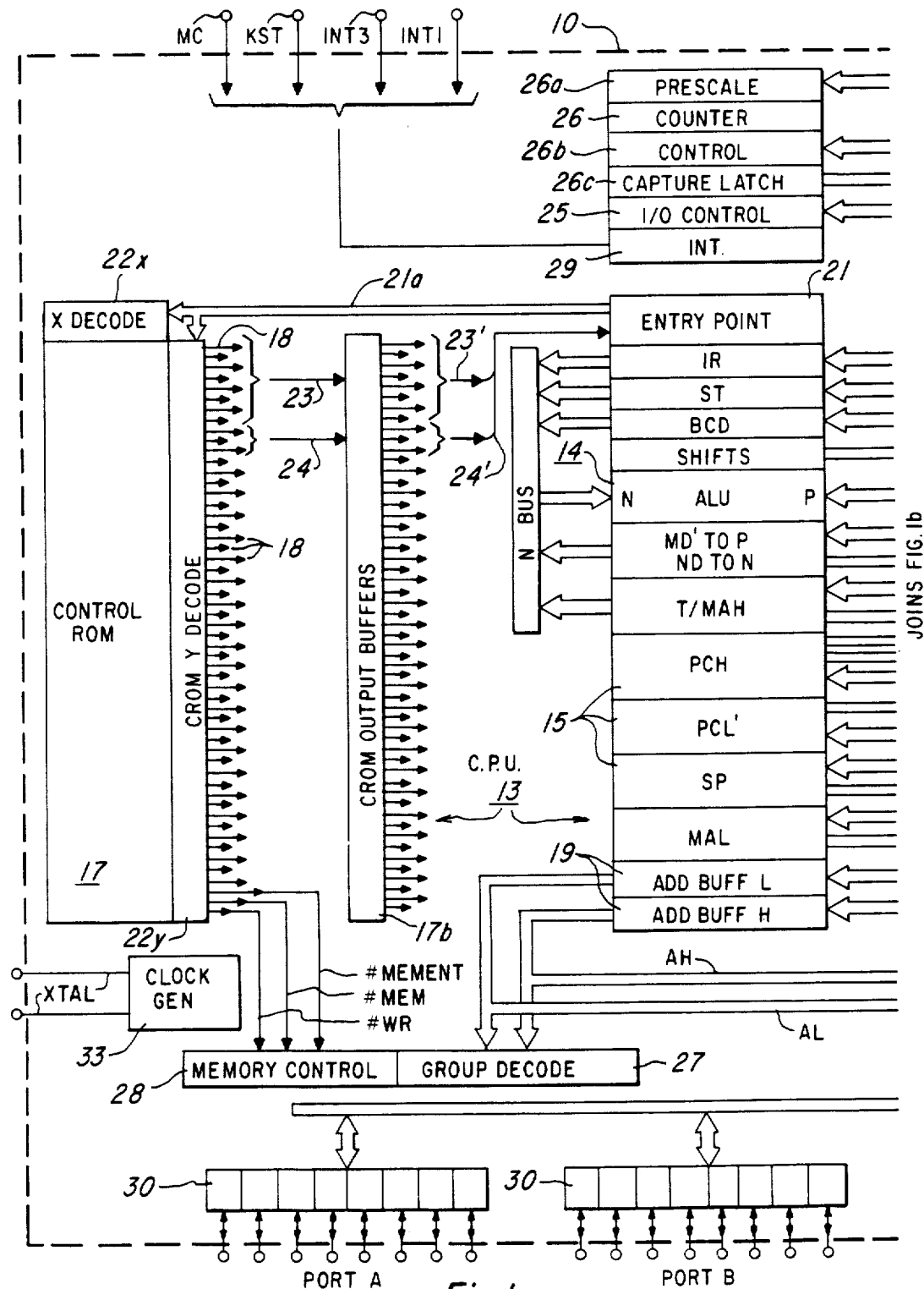
FIG. 1 comprising 1a and 1b is a block diagram of the microcomputer chip.

The invention is illustrated as applied to a single chip microcomputer. FIG. 1 is a block diagram illustrating the components of the microcomputer chip. A more detailed description of this microcomputer is contained in U.S. Pat. No. 4,450,521 entitled "Digital Processor or Microcomputer Using Peripheral Control Circuitry to Provide Multiple Memory Configurations and Offset Addressing Capability" which is herein incorporated by reference. The emphasis of this invention is on the ROM 11 program memory and the Y decode 11Y and X decode 11X. This ROM for the invention is an electrically programmed read-only memory (EPROM). The EPROM 11 is accessible via the X decode 11X and the Y decode 11Y through the memory data bus MD. This MD bus is also connected to input and output ports 30, Port A, Port B, Port C and Port D 30 to interface with external devices. The EPROM 11 contains the program memory which is executed by the microcomputer.

This embodiment contains two distinct advantages over that of the prior art. The first is that the EPROM onboard the chip may be programmed from either an external source or internally by the microcomputer itself. Secondly, the architecture of the EPROM itself allows for a simplified bit sensing circuitry. The programming capability for the EPROM 11 includes two modes: the dumb mode and the macro mode. The dumb mode is so named because the microcomputer is disabled during the programming of the EPROM 11. In the dumb mode, external devices control the actual programming of this onboard EPROM 11. The EPROM 11 is programmed as if it were a standard EPROM device such as the 2516 or 2716. However, in the macro mode, the programming of the EPROM 11 is accomplished by the onboard microcomputer using a special microcode instruction dedicated to the writing of byte locations in the EPROM 11.

Figure 2:
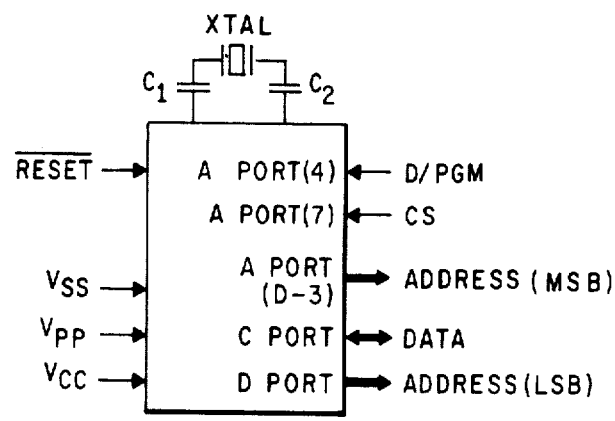
FIG. 2 is an interface diagram for the microcomputer in the dumb mode.
Figure 3:
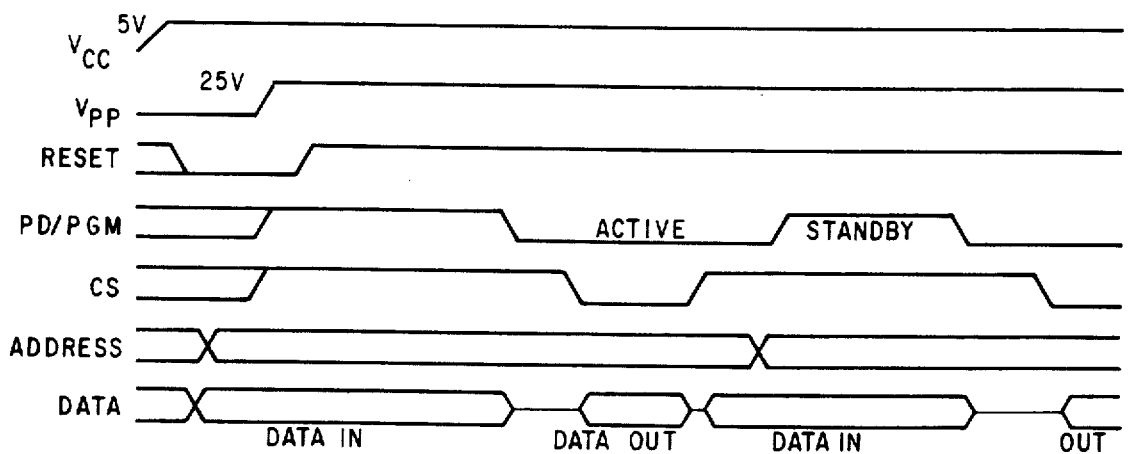
FIG. 3 is a timing diagram or the microcomputer in the dumb mode.

FIG. 2 illustrates the interface to the microcomputer required for the programming of this memory in the dumb mode. The Vss and Vcc are the power supply inputs for the microcomputer chip as before (5 volts). The Vpp is a 25 volt power input required for programming the EPROM bit locations. The RESET- signal is used to put the microcomputer into the dumb mode. The crystal, C1 and C2 provide timing to the microcomputer. Two control signals are used in the programming of the internal EPROM. The first is PD/PGM which is the program command that is input to A port position 4, A(4). This second is CS which is the chip select signal input to the 7th position of the A port A (7). The address of the memory location to be written is input to the D port for the lower significant byte and A port for the 4 bits of the upper significant byte. The actual data is input into the C port. The data can be verified after the memory write operation by using the C port to output the data at the memory address specified by port D and port A. FIG. 3 illustrates the timing for the control signals, data, and address input into the microcomputer for the configuration illustrated in FIG. 2. The Vcc signal is set to 5 volts and at some later time, the Vpp is set to 25 volts during the down time of the RESET- as shown. This signifies to the microcomputer that the microcomputer is to proceed in one of the two internal programming modes. The actual sequence required to place the microcomputer in the dumb mode is that when the RESET- goes low, Vpp be applied and then A port position 4 (CS-) be set to a 1 level. When the RESET- is returned high, the microcomputer will be in the dumb mode. In this mode, the microcomputer is programmed similar to the 2516/2716 EPROM. Addresses are applied to the D port and A port as shown by external circuitry. The addresses may be continually applied to these ports in order to verify the data. During the verify sequence, the PD/PGM signal goes low and CS- goes low. The address input into the D and A ports provides the address of the data that is then output from the C port as shown. Resetting RESET- and removing Vpp before reset becomes high will return the microcomputer to normal operation. If during the write sequence, Vpp goes low, the write will not be accomplished.

Figure 4:
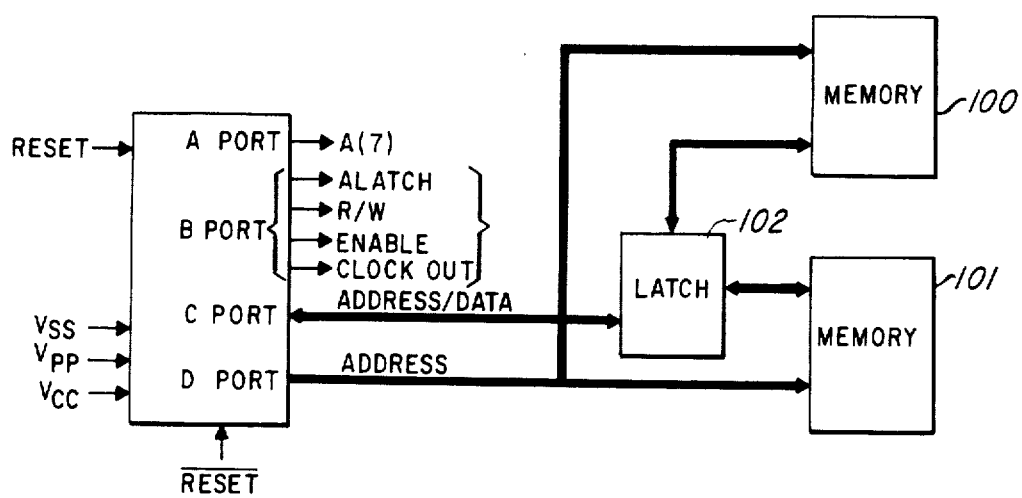
FIG. 4 is a block diagram of the microcomputer with peripherals in the macro mode.
Figure 5A:
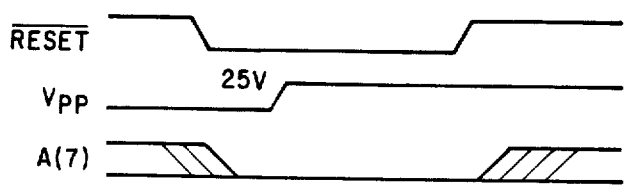
FIG. 5a and 5b are a timing diagram for the microcomputer in macro mode.

The interface required for the macro mode is illustrated in FIG. 4 to initate macro mode with Vcc applied to the microcomputer and the RESET- low, Vpp should be applied and the A(7) pin set to a zero level. When RESET- returns high, the microcomputer will be in the macro mode where it may self-program the internal EPROM 11. In this mode the microcomputer is in a "memory expansion" external mode. That is, it is in a mode where it may access the memory of external devices as described in U.S. Pat. No. 4,450,521 entitled "Digital Processor or Microcomputer Using Peripheral Control Circuitry to Provide Multiple Memory Configurations and Offset Addressing Capability". The control signals of the B port provide the handshaking required to interact with external memory devices. ALATCH provides the address indicator signal, R/W- is the read/write signal, ENABLE is the chip enable signal and CLOCKOUT is the output of the internal microcomputer clock. These signals are required by external devices in order to interface with the microcomputer. In other words, the microcomputer is producing the control signals for this interface instead of some external device as in the dumb mode. In this memory expansion mode, the external memory device addresses are actually memory mapped onto the MD bus as if they were an internal memory within the microcomputer chip. Therefore, the microcomputer can execute programs contained in any external devices as if they were contained internally. In this regard, the address to the memory device is output by the C port and D port to memory devices, 100 and 101. Memory device 100 is any typical memory device that would contain the program that would actually be executed by the microcomputer. The data contained in memory device 101 represents data that will be loaded into the EPROM internal to the microcomputer. Device 102 is a data latch such as a 74373 and is provided to latch the data for the microcomputer. The timing for this transfer of data is shown in FIG. 5a. As stated before, when the RESET- becomes low, Vpp is applied and a 0 level is applied to the 7th position of the A port, the microcomputer enters the macro mode. When the RESET- returns high, the microcomputer is in the macro mode. In this mode, the microcomputer operates exactly like the microcomputer would in normal mode, except that it now has a new instruction "PRG" (opcode 04). This instruction can be included along with any other microcomputer instructions within a program.

Figure 5B:

When the device is reset, the reset signal acts as an external interrupt and causes the program to be vectored to a location in memory where that memory location contains the address of the next instructions to be executed. In the macro mode the reset vector is fetched from external memory address EFFE and EFFF instead of FFFE and FFFF because the EPROM memory has space F000 to FFFF (containing the normal reset vector positon FFFE and FFFF) and is initially unprogrammed. This allows the microcomputer to program its own internal EPROM. If the microcomputer is reset without the Vpp (FIG. 5b), applied, then the microcomputer operates in the normal mode and the reset signal is fetched from its normal location FFFE and FFFF.

Vpp may be removed at any time while in the macro mode. This will simply cause the microcomputer to disable any writing into the EPROM. In the preferred embodiment, the PRG opcode is followed by a register file number of 1 byte. This number specifies a register pair that contains a 16 bit EPROM address F000 to FFFF to be programmed. The data that is to be written into this address is contained in the "A" register. This is simply an indirect addressing mode with the source data in the A register. In the preferred embodiment, the instruction takes approximately 26 miliseconds to execute. In order to insure that a valid write into the EPROM takes place, the "PRG" instruction must be executed two times. Since the "PRG" instruction can be included among any other microcomputer instructions, many special applications are made possible. For example, the microcomputer can be used in a smart terminal or control system in which special signatures or identification or data are entered into the microcomputer upon initialization after the system has been installed in its final environment.

Figure 6:
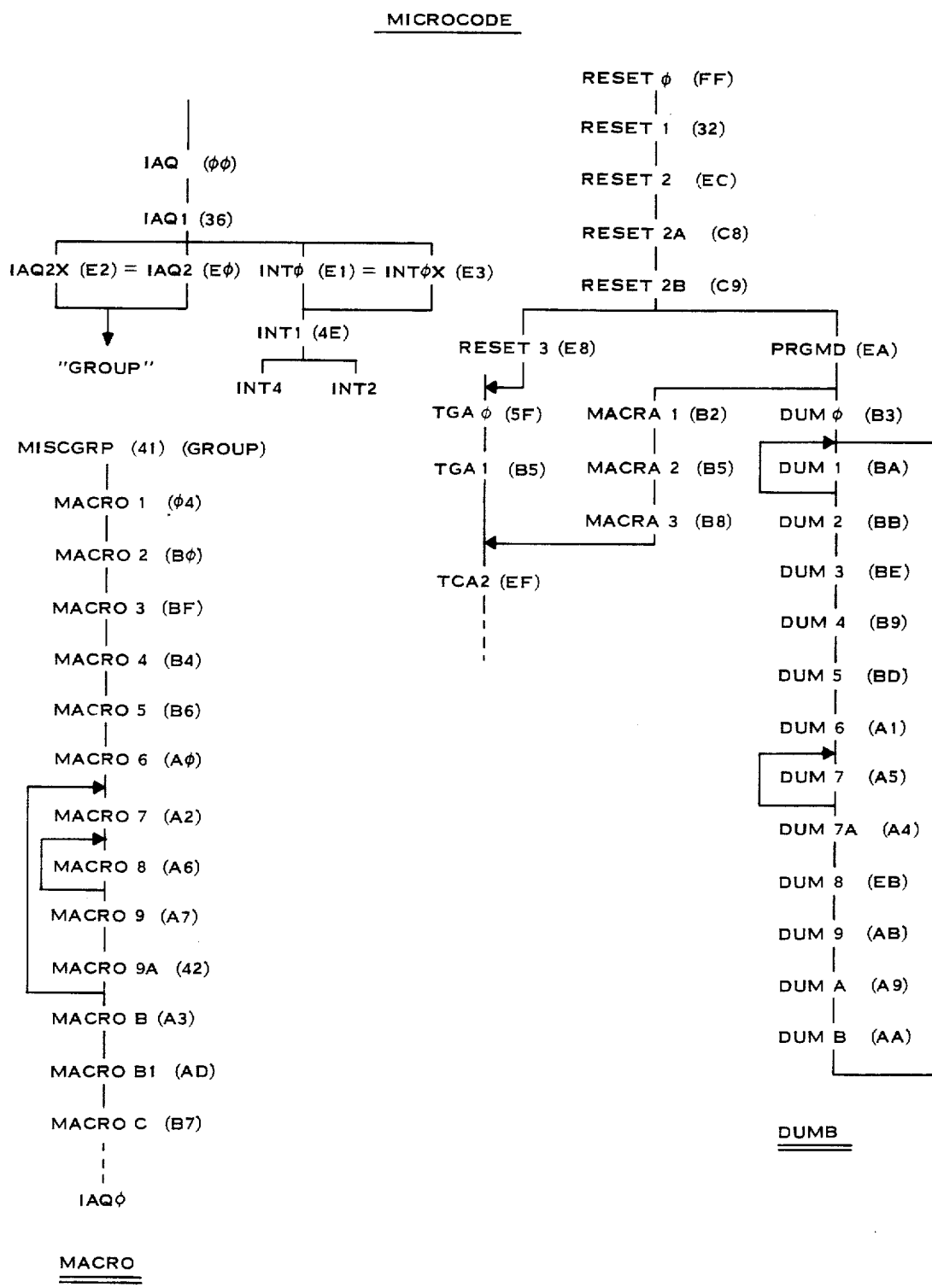
FIG. 6 is a microcode flowchart for the microcomputer illustrating both the dumb mode and macro mode.

FIG. 6 illustrates the microcode flow for the macro and dumb modes. Turning attention to the right half of the drawing, when the RESET- signal is activated, the RESET microcode sequence 0 through RESET 2B is executed. After RESET 2B has been executed, a determination is made if the high voltage is present at the Vpp terminal. If the high voltage is present, then the PRG MD (EA) microcode sequence is executed; if not, the RESET 3 (EA) is executed. If no high voltage is present, then the program is simply reset and loads the vector as before. However, if the high voltage has been set, then the computer must determine whether it is to enter the macro mode or the dumb mode. This is done by examining the 7th positon of the A port as previously discussed. If the 7th position is a 1, then the DUM sequence will be executed. If the 7th position is a 0, then the MACRA 1 through MACRA 3 sequence will be executed which changes the reset vector from FFFE and FFFF to EFFE and EFFF. In addition, the microcomputer is placed into a memory expansion architecture where the microcomputer can access off-chip memory as previously explained. Upon completion of the MACRA microcode sequence, the computer returns to normal microcode sequencing.

Figure 7A:
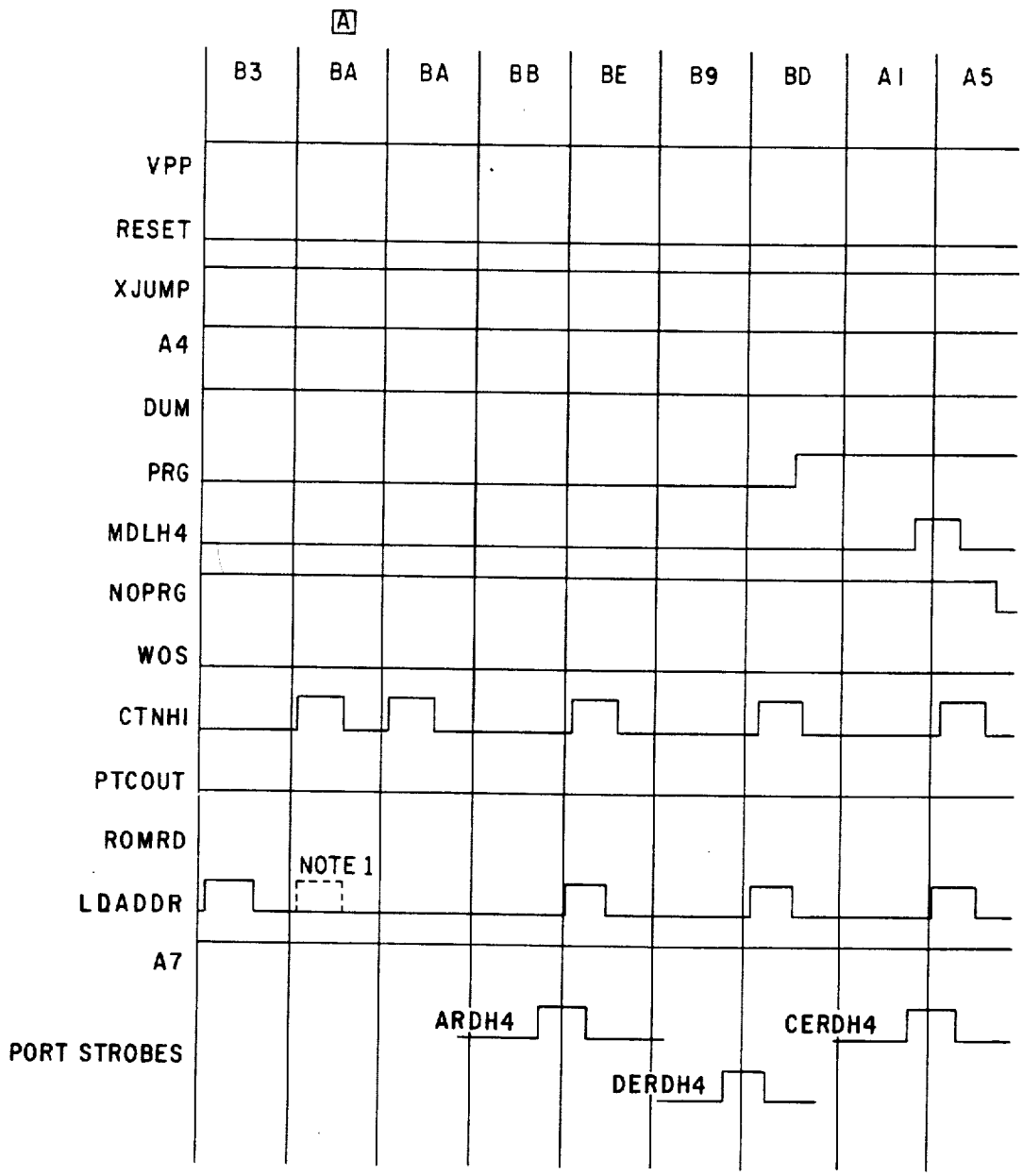
FIG. 7 comprising 7a and 7b is a timing diagram illustrating the execution of the dumb mode in microcode.
Figure 7B:
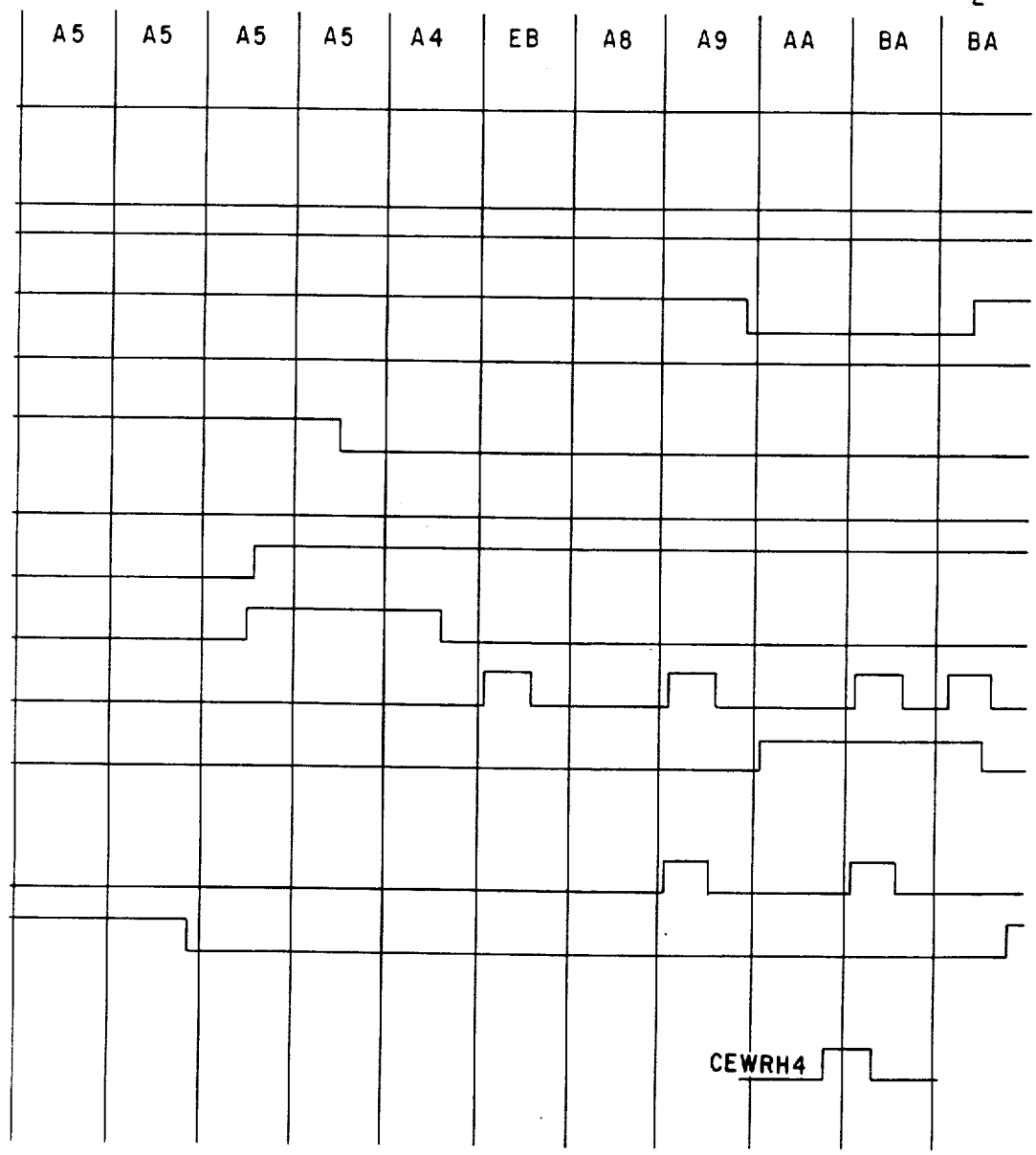

The execution of the DUM microcode sequence is illustrated in FIG. 7. In the first state DUM 1, shown in the BA column in FIG. 7, the control line CNTH1 which provides a precharge pulse to the EPROM becomes high and for this first execution of BA after DUM 0, the load address signal becomes high. During this time, the A port (A7) position is being read. The sequence continues the reading of the A port (D-3) as shown by signal ARDH4 in FIG. 7. This completes the read of the most significant of the bits of the address. This is followed by a reading of the D port which contains the least significant bit positions of the address illustrated by DUM 4 and DUM 5. DUM 6 initiates the data read requiring both a precharge from CTNH1 and the load address signal on LDADDR. Note that D7 continues until the PD/PGM signal goes low to signify a WRITE as shown in FIG. 7. This loop is required so that the data is properly programmed into the EPROM. WOS then becomes high to discharge the EPROM after the high voltage write. The sequencing DUM 7A through DUM B illustrates the completion of the write and the validation or verification of data input. This is shown by the port strobe CEWRH4 which outputs the data at the appropriate address on the C port as previously explained.

Figure 8A:
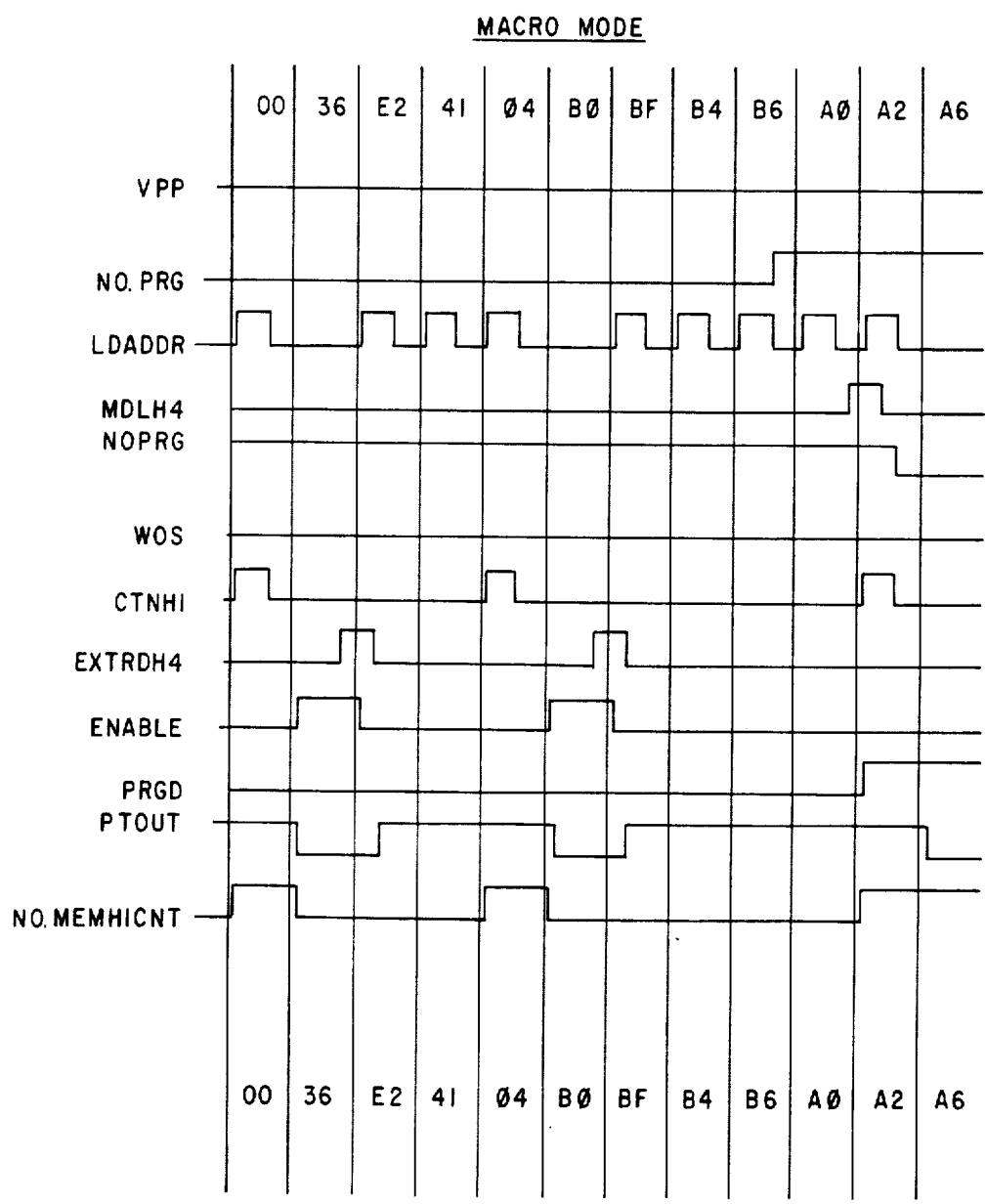
FIG. 8 comprising 8a and 8b is a timing diagram representing the execution of the microcode for the macro mode.
Figure 8B:
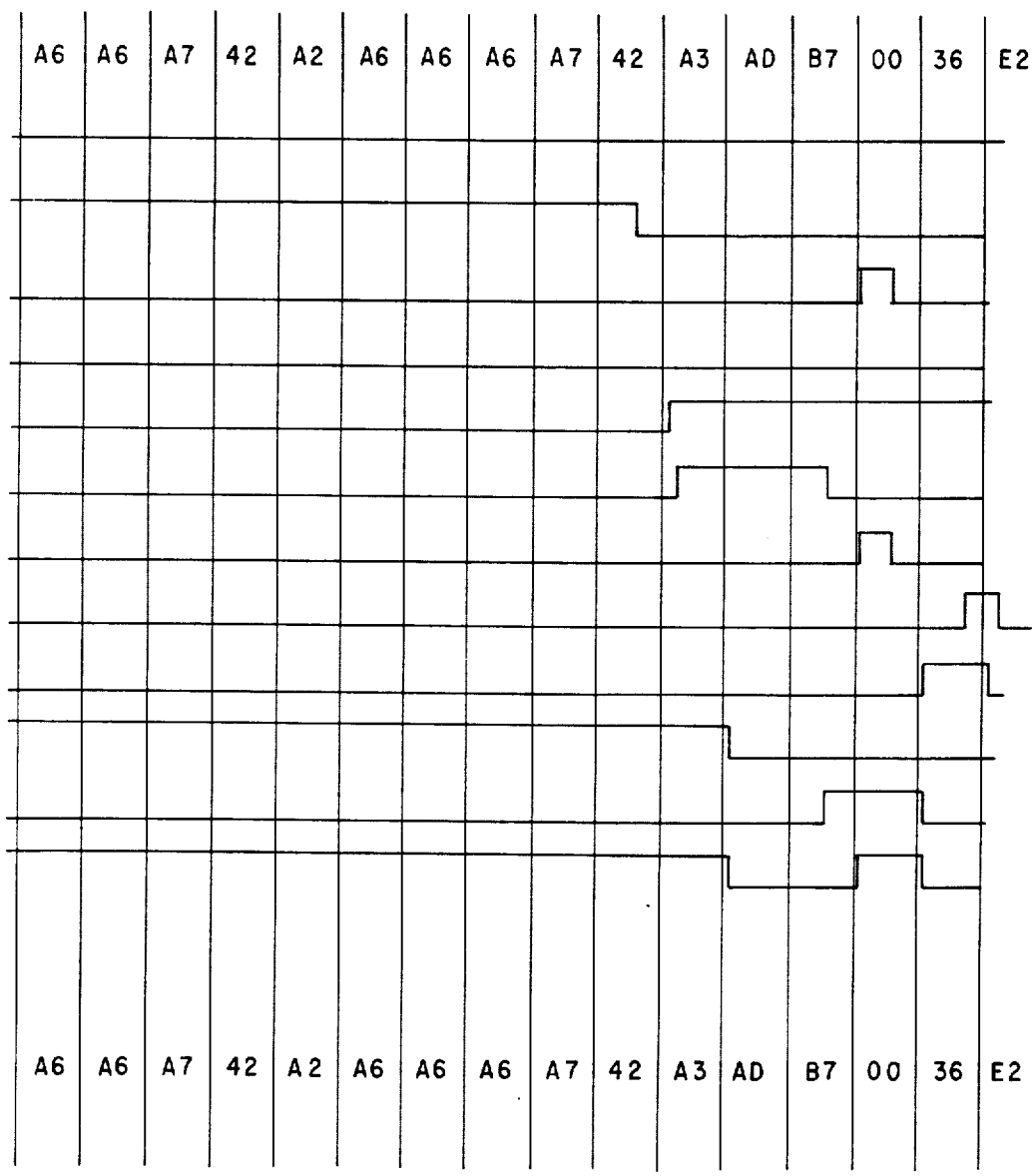

FIG. 8 illustrates the execution of the microcode sequence MACRO 1 through MACRO C. It should be noted that the execution of this sequence occurs when the PRG instruction is executed. For the proper programming of internal EPROM this microcode instruction sequence should be executed twice. The first set of microinstructions, MACRO 1 through MACRO 6, establish the indirect addressing of the information to be written into the EPROM. The loop MACRO 7 through MACRO 9 and the loop MACRO 8 are software timing loops executed while the data is written to the EPROM byte positions. The final set of code macro B through macro C provides the discharge of the high voltage from the EPROM. There is no verify sequence for the MACRO mode because verification may be accomplished by a software read and compare by the program being executed.

Referring now to FIG. 8, the PRG signal is shown occurring when the Vpp power is high. The load address LDADDR signal occurs during the microcode sequence as shown. MDLH4 provides a pulse to load the MD latch which contains the data to be written into the EPROM. The NOPRG signal is a no program signal that actually initiates the writing of the bit positions in the EPROM while isolating the X, Y, and Z decode. WOS provides the discharge of the high voltage after no program NOPRG goes high. This removes any remaining voltage in the memory matrix.

The remaining microflow shown at the top left portion of FIG. 6 illustrates that during execution of instructions in micromode, an interrupt jump executed after IAQ1 will cause either 1 of 4 states to be executed. If a high voltage is present, (Vpp), then IAQ2X or INT2X will follow and the microcomputer is in MACRO mode. If no high voltage is present, then IAQ2 or INT2 will follow and the microcomputer is in the normal operating mode. It should be noted that all the microcode discussed connects with a normal microcomode sequencing in the microcomputer. The remainder of the microcode sequencing is illustrated in U.S. Pat. No. 4,450,521 entitled "Digital Processor or Microcomputer Using Peripheral Control Circuitry to Provide Multiple Memory Configurations and Offset Addressing Capability".

EPROM STRUCTURE

Figure 9:
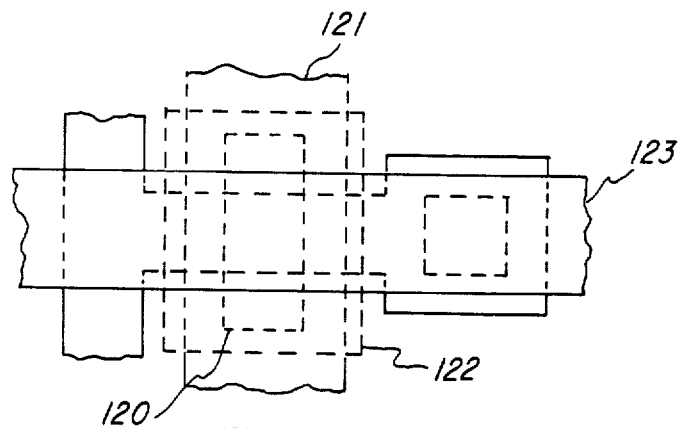
FIG. 9 is a top view of the EPROM memory element.

FIG. 9 illustrates a top view of the EPROM bit gate layout. The EPROM gate structure consists of two gates, the first gate 120 is located above the channel on top of a clean oxide and is isolated from the second gate 121 which is located above the first gate 120. Gate 120 is referred to as a floating gate. The region below the gate 122 is a P+ enhanced region. The gate structure is covered by a metal strip 123.

Figure 10:
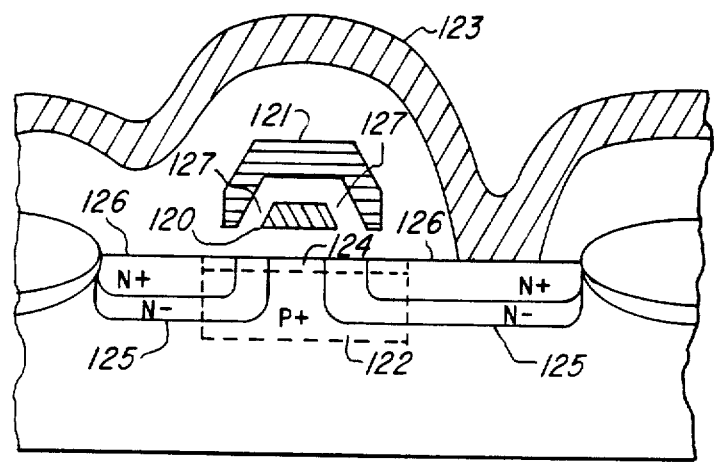
FIG. 10 is a side, cross-sectional view of the EPROM memory element.

FIG. 10 illustrates a side cross sectional view of the bit layout. The floating gate 120 is located 800 angstroms above the channel region 124 and isolation oxide region 127 that is 1100 angstroms thick is located on top of the floating gate 120 and underneath the second polygate 121. The FAMOS device includes source and drain regions 125. An enhanced N+ region 126 is implanted to give the device a higher breakdown voltage. The P+ tank region 122 is a P+ implant underneath the floating gate 120. When the cell is to be programmed, a high voltage is applied to the second polysilicon gate 121 and to the drain 126. The source region 125 is grounded. The effect of this configuration is to cause electrons to collect at the bottom of the floating gate 120, thus causing the channel 24 to become a P type region. Once programmed, this gate will not discharge during a read sequence. To erase the programmed bits, the device is exposed to an ultraviolet light which strips away the electrons from beneath the floating gate 120.

Figure 12:
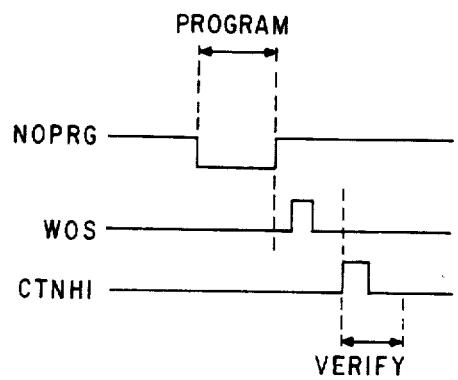
FIG. 12 is a simple timing diagram for the circuitry in FIG. 11.
Figure 11:
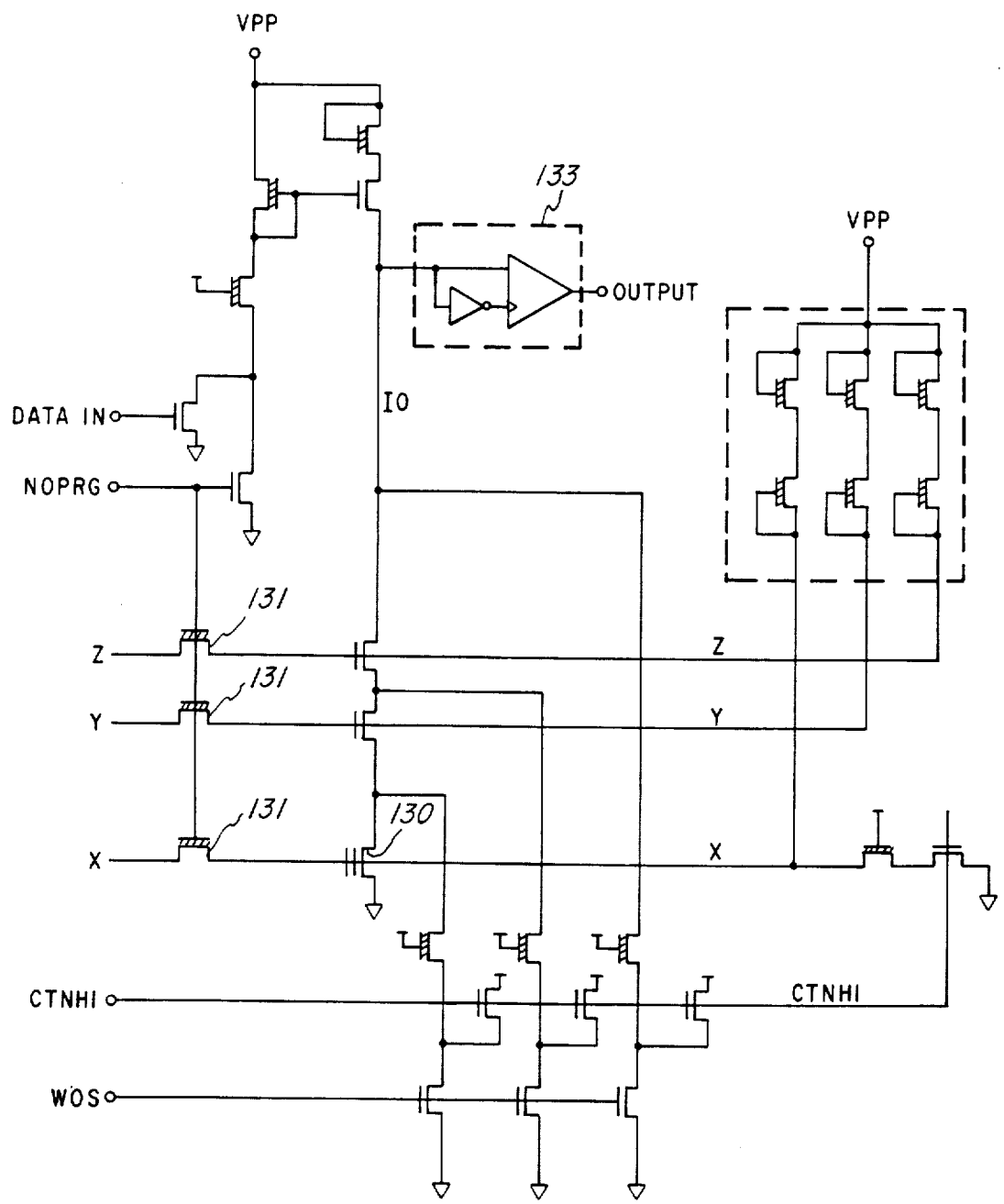
FIG. 11 is a schematic drawing of a single EPROM memory element with the associated control and addressing circuitry.

FIG. 11 illustrates the decoding circuitry and control circuitry for a single bit 130. Devices 131 are provided to isolate the accesss of the X, Y and Z decoder and multiplexer. Circuitry 132 is provided to current limit any current to the bit 130 during the writing of this bit position. The application of Vpp to the bit position is controlled by the DATA IN and NOPRG lines as shown. Also provided is the control signal CTNH1 and WOS previously discussed. A simplified timing diagram is shown in FIG. 12. Note that during NOPRG being low, the Vpp voltage is applied to the device 130. During the signal WOS, there is a high voltage discharge provided to discharge any remaining high voltage from the bit lines after NOPRG goes high. The CTNH1 signal provides a pulse to precharge initially the nodes in order that they may be read. All bit lines are precharged to 25 volts. When addressed, if any bit lines contain any addressed unprogrammed bit devies, the bit line is discharged producing a voltage of approximately 1 volt. Because the voltage difference between the discharged and undischarged bit line is approximately a volt, the output sensing circuitry 133 is relatively simple as shown. If the bit has not been programmed, then the bit node will discharge when the gate of device 130 becomes active when the appropriate X, Y and Z decoding circuitry lines are activated through devices 131. Upon precharging the bit node, device 130 will discharge the bit node when the decoding circuitry becomes active. Therefore, the MD bus will be discharged. However, if the gate has been programmed and the device is addressed, then the node will remain charged and will output a voltage of about two volts to the sensing circuitry 133 and the MD bus will not be discharged.

Figure 13A:
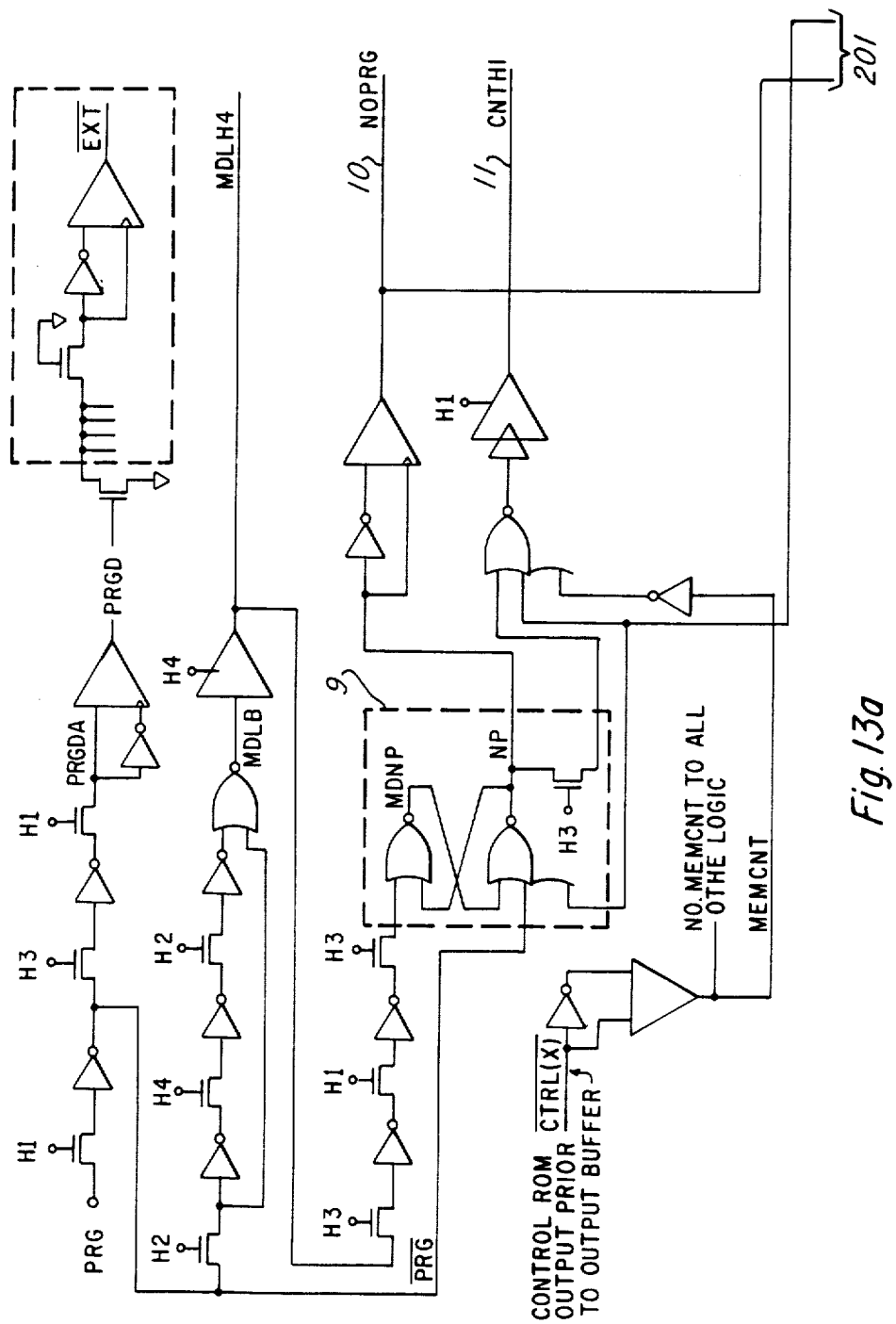
FIG. 13 comprising 13a, 13b and 13c is a schematic diagram of the circuitry that produces the control signals for the EPROM.
Figure 13B:
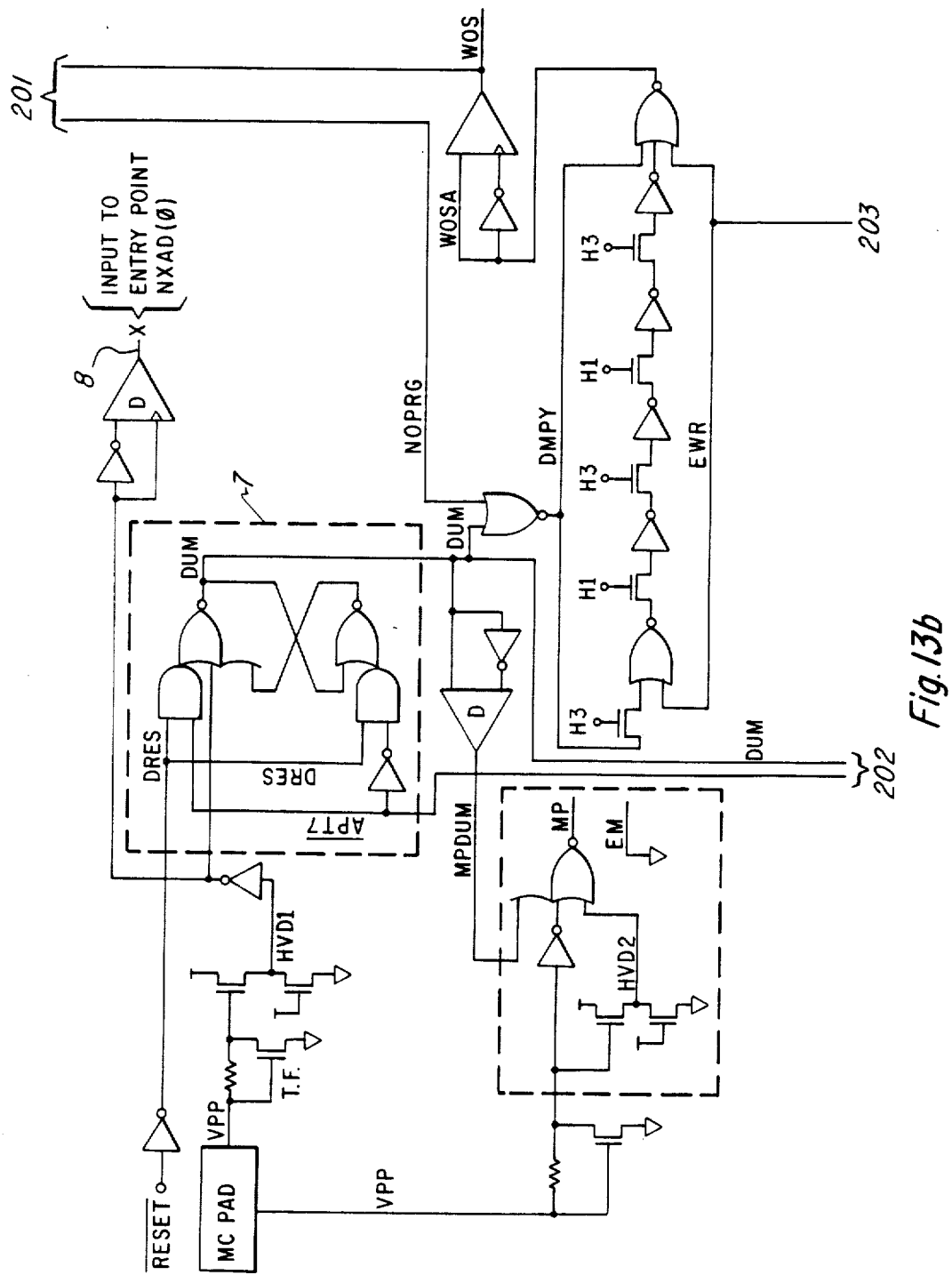
Figure 13C:
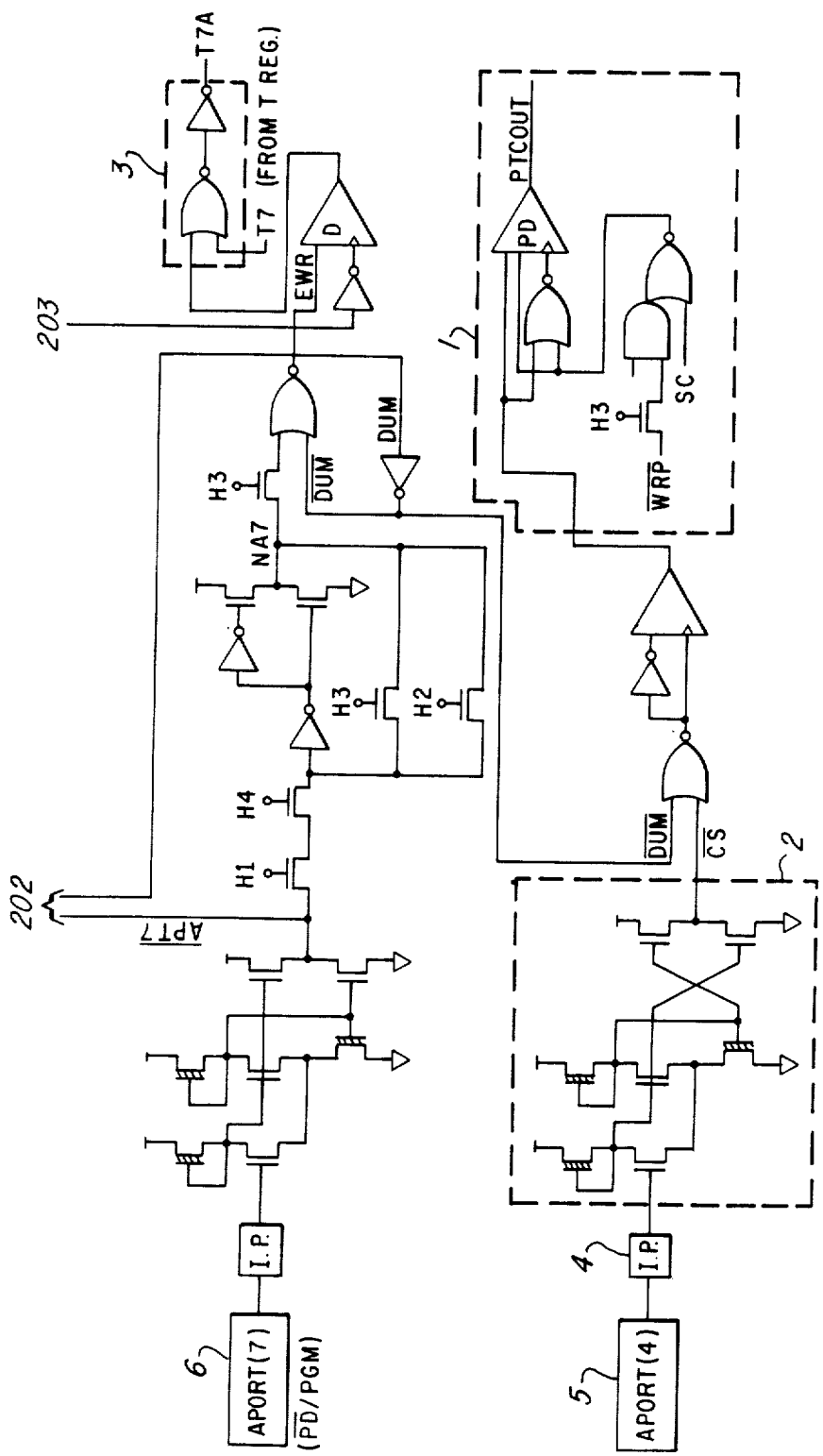

FIG. 13 illustrates the schematics of the circuits that produce the control signals for the EPROM. Signals received by A port position 7 and A port position 4 are illustrated as pads 6 and 5, respectively. Referring to pad 5, the signal is received and is input through input protection circuitry 4 which protects the input circuitry in the microcomputer from high static voltage and includes a Zener diode in a thick field device. Circuitry 2 is provides as a Schmitt trigger. The Schmitt trigger 2 provides TTL compatibility for the CS- signal. The CS- signal is used to produce the PTCOUT signal to signify to the C port that it is in the output mode. This signal is ORd with the DUM- signal provided from DUM latch 7. Note that the PD-/PGM signal is used by the circuitry connected to A port (7) to also produce the signal T7A to be used by the microprogramming flow circuitry to provide the timing loop for the write in the dumb mode. The high voltage Vpp is applied to the MC pad and is used in DUM latch 7 to indicate that high voltage has been applied. This latch stays set until reset. This signal is also used by the circuitry 8 to provide data for execution of the correct microcode sequencing as previously discussed in FIG. 6. The NOPRG and CTNH1 signals are produced from the execution of the PRG microcode instruction. The WOS signal used to discharge the high voltage from the memory matrix is produced from the Vpp input. The circuitry for the NOPRG signal includes a latch 9 that is to provide NOPRG for a sufficient time to write the data into the 5 bit positon.

Figure 14A:
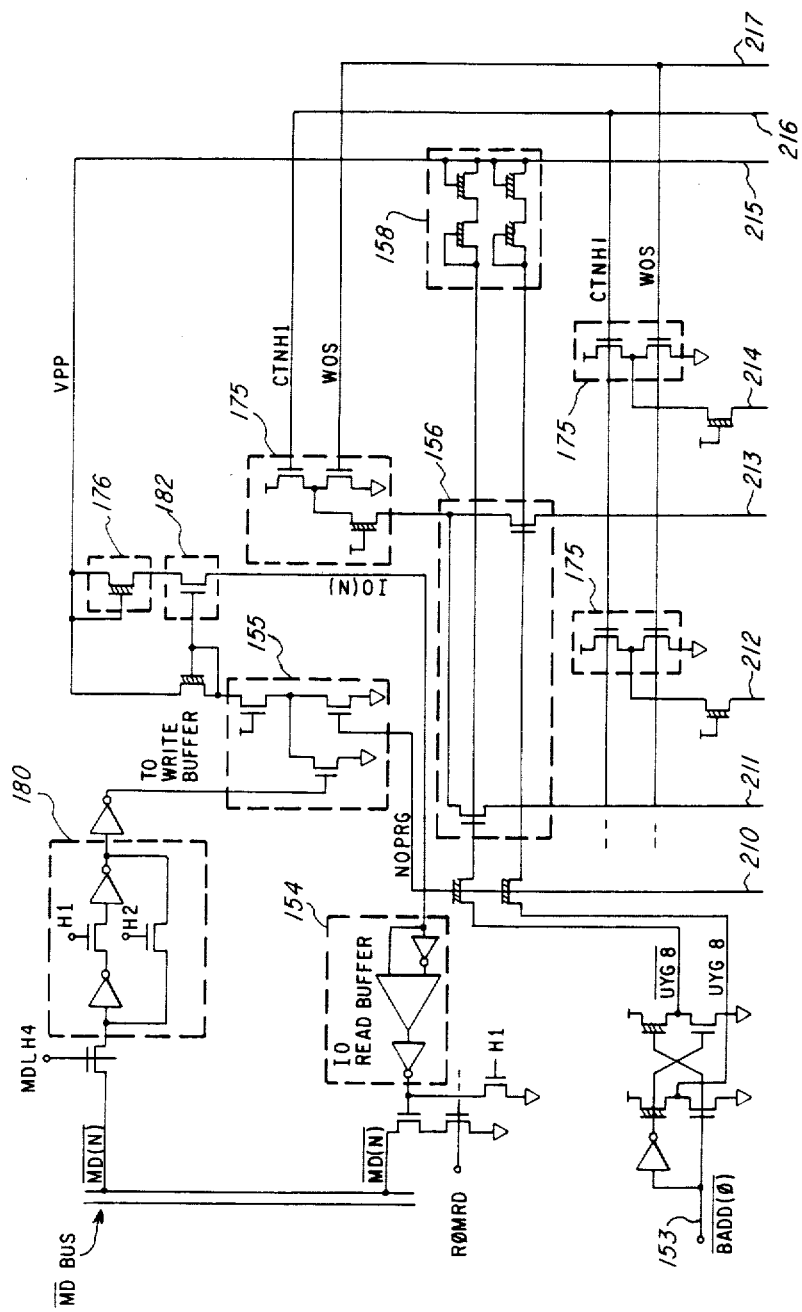
FIG. 14 comprising 14a, 14b and 14c is a schematic diagram of a byte of EPROM memory with its associated input/output circuitry and addressing circuitry.
Figure 14C:
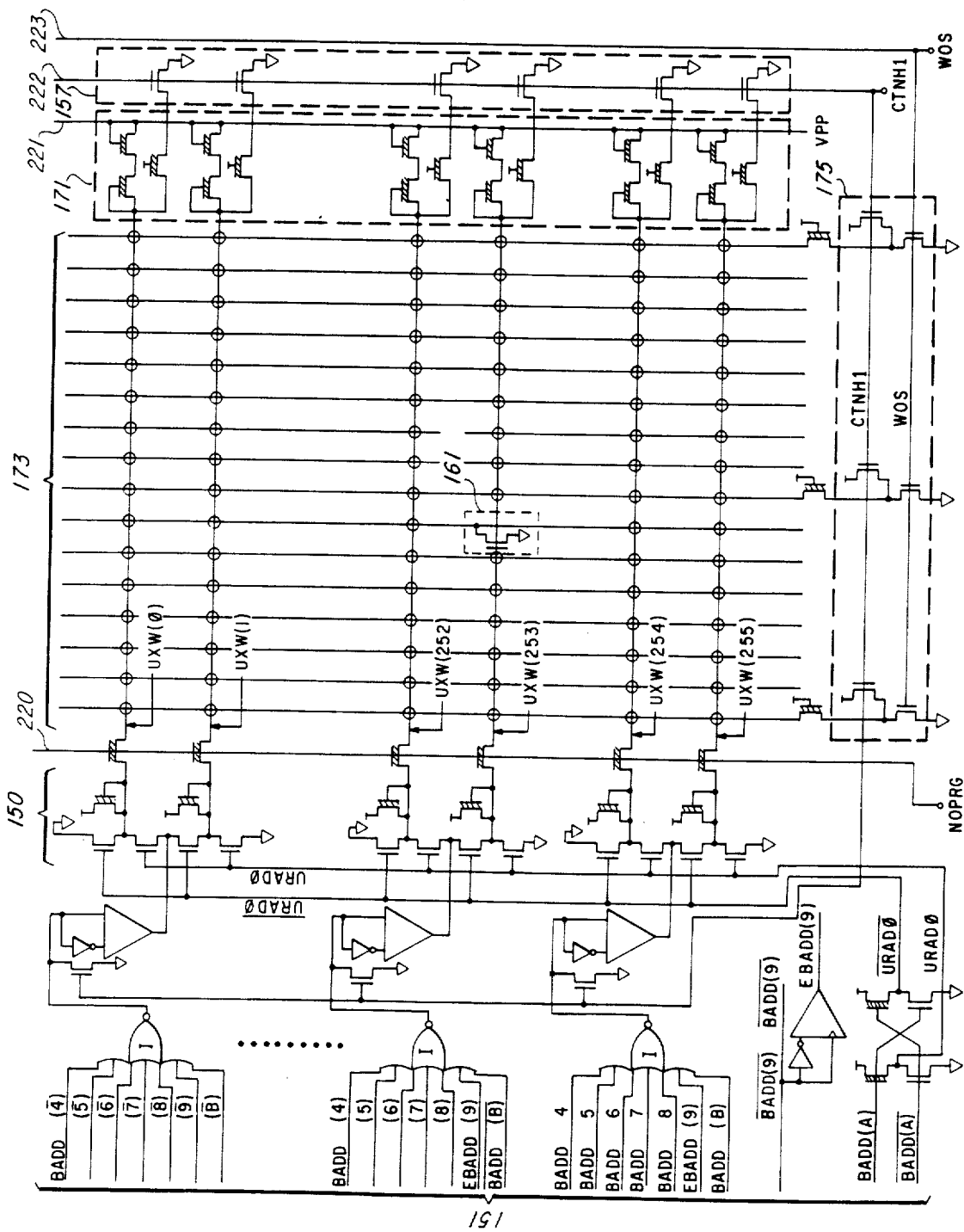

A schematic of the memory array is shown in FIG. 14. This illustrates one bit out of a byte for the 4096 bits in the array. The X address decoding circuitry 151, Y address decoding circuitry 152 and Z address decoding circuitry 153 is illustrated connecting to multiplex circuitry 150 for the X address 151; multiplex circuitry 170 connected to the Y address circuitry 152 and the Z address connected directly to the array. The addressing for this array is similar to the addressing for any normal EPROM. The bit lines are addressed by the Y and Z portion of the address word while the floating gate is addressed by the X portion. The actual selecting circuitry for Z address is shown at 156 and the Y selecting circuitry is illustrated in the circuitry for 157. Current limiting circuitry 159 is connected to the Y decode circuitry 157 to limit the amount of current provided to the bit during the programming mode by the voltage Vpp. The same current limiting circuitry 158 is applied to Z decoding circuitry 156 and likewise, once the current limiting circuitry 171 is coupled to the X addressing circuitry in the array 173. The array 173 contains all the floating gate cells, such as 161 for the byte addresses. The control lines CTNH1 and WOS are connected to the arrays via circuitries 157 and 175. The CTNH1 device is in circuitries 157 discharges the X addressing circuitry. The CTNH1 devices in circuitry 175 provides the 2.5 volt precharge for 200 NS. The reading sequence is for 600 NS. The fact that the cells are precharged results in the discharge for a bit read of approximately 1 volt. Therefore, the sense amplifier in circuitry 154 is much simplier than a normal sense amplifier for an EPROM. Circuitry 159 is a transistor standard data ratio pushpull inverter. In the prior art, the sense amplifiers to read the bit locations in EPROM were normally multiple stage differential amplifiers in order to detect millivolt ranges; however, with the voltage from the EPROM circuitry in the range of 1 volt only a simple amplifier is required. The programming of the array by the voltage Vpp is controlled by the no program control signal and the MD bus at circuitry 155. Latch 180 stores the data to be written. The output of Latch 180 and NOPRG are input to circuitry 155 to control the high voltage switch 182. Device 176 is a depletion device which prevents Vpp from degrading the breakdown voltage of device 182 in the array.

What I claim is:

1. An electronic digital processor system, comprising a microcomputer formed on a single integrated circuit, wherein said microcomputer comprises:
   an electrically programmable read only memory means having a plurality of address locations, each such location for storage of data, or of an instruction which defines an operation upon data;
   a data path connected to said electrically programmable memory means for transfer of data, commands and addresses;
   external terminals, connected to said data path, for transfer of data to and from circuits external to said electronic digital processor system;
   a register means connected to said data path having a plurality of separate registers for temporary storage of data and temporary storage of addresses for accessing a corresponding address location of said electrically programmable memory means;
   storage means for storing microcode commands, said microcode commands comprising:
      a first microcode sequence of microcode commands for controlling the connecting of said electrically programmable memory means to said external terminals via said data path so that it may be programmed with data presented to said external terminals; and
      a second microcode sequence of microcode commands for controlling the programming of said electrically programmable memory means with the data stored in a first register of said register means;
   arithmetic and logic means, connected to said data path and to said storage means, for performing operations upon data received via said data path in accordance with instructions received from said electrically programmable memory means, for connecting said electrically programmable memory means to said external terminals so that it may be programmed with data presented to said external terminals in accordance with said first microcode sequence, and for programming said electrically programmable memory means with said data stored in said first register of said register means in accordance with said second microcode sequence; and
   interrupt means, connected to said external terminals and to said arithmetic and logic means, for causing said arithmetic and logic means to begin execution of said first microcode sequence responsive to a first reset signal received at said external terminals, and for causing said arithmetic and logic means to begin execution of said second microcode sequence responsive to a second reset signal received at said external terminals.

2. An electronic digital processor system as claimed in claim 1, wherein said external terminals comprise:
   a plurality of input/output ports for transfer of data to and from circuits external to said microcomputer;
   and wherein said microcomputer further comprises peripheral control circuitry connected to said data path, said arithmetic and logic means, and said plurality of input/output ports for accessing a selected one of said plurality of input/output ports for communication of instructions for defining the operation of said arithmetic and logic means from circuits external to said microcomputer.

3. An electronic digital processor system as claimed in claim 2, further comprising:
   a first external memory means connected to one of said input/output ports for storing instructions for transmission to and control of said arithmetic and logic means via said input/output port, said peripheral control circuitry and said data path.

4. An electronic digital processor system as claimed in claim 3, further comprising:
   a second external memory means connected to one of said input/output ports for storing therein data and instructions to be programmed into said electrically programmable memory means; and
   wherein said first external memory means includes an instruction stored therein for defining the operation of said arithmetic and logic means to transfer data and instructions stored in said second external memory to said first register of said register means and an instruction for programming the contents of said first register into said electrically programmable memory means.

5. An electronic digital processor system as claimed in claim 4, further comprising:
- a latch circuit disposed between said input/output ports and said first and second external memory means for storage of data and addresses.

6. An electronic digital processor system formed on a single integrated circuit comprising:
- an electrically programmable read only memory means having a plurality of address locations for storage of data or a command which defines an operation upon data at each of said address locations;
- a plurality of data paths connected to said electrically programmable memory means for transfer of data, commands and addresses;
- a register means connected to said plurality of data paths having a plurality of separate registers for temporary storage of data and temporary storage of addresses for accessing corresponding address location of said electrically programmable memory means;
- a plurality of input/output ports for transfer of data to and from circuits external to said electronic digital processor system;
- microcode storage means for storing microcode commands, said microcode commands comprising:
  - a first microcode sequence of microcode commands for controlling the connecting of said electrically programmable memory means to a first one of said input/output ports; and
  - a second microcode sequence of microcode commands for controoling the programming of said electrically programmable memory means with the data stored in a first register of said register means; and
- an arithmetic and logic means connected to said plurality of data paths, said arithmetic and logic means including control and timing circuitry for performing operations upon data in accordance with commands stored in said electrically programmable memory means received via said data paths, for connecting said electrically programmable memory means to said first one of said input/output ports so that it may be programmed with data presented to said first one of said input/output ports in accordance with said first microcode sequence, and for programming said electrically programmable memory means with said data stored in said first register of said register means in accordance with said second microcode sequence;
- peripheral control circuitry connected to said plurality of data paths and said plurality of input/output ports to permit receipt of commands, including said programming command, from circuits external to said electronic digital processor system; and
- interrupt means, connected to a second one of said input/output ports and to said arithmetic and logic means, for causing said arithmetic and logic means to begin execution of said first microcode sequence responsive to a first reset signal received at said second input/output port, and for causing said arithmetic and logic means to begin execution of said second microcode sequence responsive to a second reset signal received at said second input/output port.

* * * * *